United States Patent [19]
Deprez et al.

[11] Patent Number: 5,512,413
[45] Date of Patent: Apr. 30, 1996

[54] IMAGING ELEMENT FOR MAKING A LITHOGRAPHIC PRINTING PLATE ACCORDING TO THE SILVER SALT DIFFUSION TRANSFER PROCESS

[75] Inventors: Lode Deprez, Wachtebeke; Eddy Michiels, Duffel, both of Belgium

[73] Assignee: AGFA-Gevaert N.V., Mortsel, Belgium

[21] Appl. No.: 466,083

[22] Filed: Jun. 6, 1995

Related U.S. Application Data

[63] Continuation of Ser. No. 340,033, Nov. 14, 1994, abandoned.

[30] Foreign Application Priority Data

Dec. 2, 1993 [EP] European Pat. Off. .............. 93203378

[51] Int. Cl.$^6$ .............................. G03C 1/30; G03C 8/06; G03F 7/07
[52] U.S. Cl. ..................... 430/204; 430/229; 430/230; 430/622
[58] Field of Search .................... 430/204, 229, 430/230, 622

[56] References Cited

U.S. PATENT DOCUMENTS

| | | | |
|---|---|---|---|
| 3,642,486 | 2/1972 | Burness et al. | 430/621 |
| 4,173,481 | 11/1979 | Sera et al. | 430/622 |
| 4,349,624 | 9/1982 | Sobel et al. | 430/622 |
| 4,510,228 | 4/1985 | Tsubai et al. | 430/204 |
| 4,606,985 | 8/1986 | Takaya et al. | 430/204 |
| 5,281,509 | 1/1994 | Murakata et al. | 430/204 |
| 5,340,691 | 8/1994 | Vaes et al. | 430/204 |
| 5,368,980 | 11/1994 | Davies | 430/204 |

FOREIGN PATENT DOCUMENTS

| | | |
|---|---|---|
| 0554585 | 8/1993 | European Pat. Off. . |
| 61-46949 | 3/1986 | Japan . |
| 62-144171 | 6/1987 | Japan . |

*Primary Examiner*—Richard L. Schilling
*Attorney, Agent, or Firm*—Brumbaugh, Graves, Donohue & Raymond

[57] ABSTRACT

The present invention provides an imaging element comprising on the same side of a support in the order given a base layer, a light sensitive layer containing a silver halide emulsion and a surface layer comprising physical development nuclei characterized in that said base layer and/or said light-sensitive layer comprises gelatin being hardened with a divinylsulfonyl hardener such that the time needed to completely brake down said base layer, light sensitive layer and surface layer using an aqueous solution of 0.14% by weight of NaOCl at 25° C. is between 1000s and 1600s. A lithographic printing plate can be obtained with such imaging element according to the silver salt diffusion transfer process and exhibits an improved printing endurance.

7 Claims, No Drawings

IMAGING ELEMENT FOR MAKING A LITHOGRAPHIC PRINTING PLATE ACCORDING TO THE SILVER SALT DIFFUSION TRANSFER PROCESS

This application is a continuation of application Ser. No. 08/340,033, filed on Nov. 14, 1994, now abandoned.

DESCRIPTION

1. Field of the Invention

The present invention relates to a method for manufacturing a lithographic printing plate precursor and to a method for producing a lithographic printing plate therewith.

2. Background of the Invention

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. The DTR-image can be formed in the image-receiving layer of a sheet or web material which is a separate element with respect to the photographic silver halide emulsion material (a so-called two-sheet DTR element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method. For example the United Kingdom Patent Specification 1,241,661 discloses a method for the production of a planographic printing plate consisting of a sheet material comprising an outer hydrophilic colloid layer on the surface of which there is concentrated a silver image stemming from an underlying exposed silver halide emulsion layer by the silver complex diffusion transfer reversal process. The silver image formed on the surface is suitable for printing images in a lithographic printing process using a dampening liquid.

Commercial lithographic printing plate precursors of the latter type typically contain on a support in the order given a base layer serving as an anti-halation layer, a silver halide emulsion layer and a surface layer containing physical development nuclei in which the silver image is formed. In order to obtain good printing properties the silver halide emulsion layer and/or the base layer are hardened by means of formaldehyde. Although other hardeners have been disclosed as possible substitutes for formaldehyde (see e.g. EP 532076), they have not been used so far because of poor printing properties that were obtained.

A particular disadvantage of formaldehyde as a hardener is the fact that large amounts of hardener need to be used and that the reproducibility of the hardening is poor causing fluctuations in the lithographic printing plate properties.

Numerous attempts have been made to improve the lithographic printing properties especially the printing endurance of a lithographic printing plate obtained using a lithographic printing plate precursor as described above. These attempts are illustrated by the following disclosures.

The U.S. Pat. Nos. 4,297,429, 4,297,430 and U.S. Pat. No. 4,355,290 disclose the use of respectively cyclic imides, oxazolidones and 2-mercaptobenzoic acid as silver halide solvents in the DTR-process for improving the lithographic printing properties. Japanese patent no 1,355,795 discloses an imaging element as lithographic printing plate precursor containing most of the matting agent used in the base layer comprised between the support and the photosensitive silver halide emulsion layer. In DE 39 06 676 it is disclosed to include an intermediate hydrophilic layer between the photosensitive layer and the layer containing physical development nuclei for increasing the printing endurance. For the same purpose U.S. Pat. No. 4,772,535 discloses the use of a light insensitive silver halide layer between the support and the photosensitive silver halide layer. EP 532076 discloses a method for producing a lithographic printing plate precursor wherein at least one of the hydrophilic colloid layers is coated from a solution containing at least 7.5% of said hydrophilic colloid. A lithographic printing plate precursor thus obtained yields printing plates with an increased printing endurance. Still other disclosures relating to the improvement of the lithographic printing properties of DTR-monosheet printing plates are well known to the person skilled in the art.

Despite these numerous publications the need still exists for further improving the printing properties especially the printing endurance of DTR-monosheet printing plates and reducing the number of useless copies at the start of the printing process.

SUMMARY OF THE INVENTION

It is an object of the present invention to provide an imaging element for making an improved lithographic printing plate according to the DTR-process. It is a particular object to improve the printing endurance of such a printing plate and to reduce the number of useless copies at the start of the printing process.

It is a further object of the present invention to provide a method for making an improved lithographic printing plate according to the DTR-process.

Further objects of the present invention will become clear from the description hereinafter.

According to the present invention there is provided an imaging element comprising on the same side of a support in the order given a base layer, a light sensitive layer containing a silver halide emulsion and a surface layer comprising physical development nuclei characterized in that said base layer and/or said light-sensitive layer comprises gelatin hardened with a divinylsulfonyl hardener such that the time needed to completely brake down said base layer, light sensitive layer and surface layer using an aqueous solution of 0.14% by weight of NaOCl at 25° C. is between 1000s and 1600s.

According to the present invention there is provided a method for making a lithographic printing plate according to the DTR-process comprising the steps of image-wise exposing an imaging element as defined above and subsequently developing a thus obtained image-wise exposed imaging element in the presence of a developing agent and a silver halide solvent by means of an alkaline processing liquid.

DETAILED DESCRIPTION OF THE PRESENT INVENTION

It has been found that by using a divinylsulfonyl hardener such that a hardening at the photosensitive side of the imaging element is obtained as described above, the printing endurance of a printing plate obtained therefrom according to the DTR-process is improved. Furthermore the number of useless copies that have to be disposed off at the beginning of the printing process because of ink acceptance in the non-image areas is limited.

Preferred divinylsulfonyl hardeners for use in connection with the present invention correspond to the following formula (I):

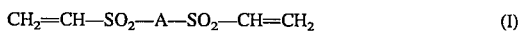

$$CH_2=CH-SO_2-A-SO_2-CH=CH_2 \qquad (I)$$

wherein A represents a divalent linking group selected from the group consisting of:

- a substituted or unsubstituted aliphatic or aromatic hydrocarbon group containing 1 to 8 carbon atoms and
- —X—O—X' wherein X and X' each independently represent a substituted or unsubstituted aromatic or aliphatic hydrocarbon group, the total number of carbon atoms in X an X' not exceeding 8.

Suitable examples of divinylsulfonyl hardeners for use in connection with the present invention are disclosed in e.g. U.S. Pat. Nos. 3,841,872 and 3,642,486. Specific examples of divinylsulfonyl hardeners for use in connection with the present invention are bis(vinylsulfonyl)methane, 1,2-bis(vinylsulfonyl)ethane, 1,3-bis(vinylsulfonyl)-propane, 1,2-bis-(vinylsulfonyl) propane, 1,3-bis(vinylsulfonyl)-butane, 1,4-bis(vinylsulfonyl)-butane, 1,3-bis(vinylsulfonyl)-2-propanol, bisvinylsulfonyl ethers such as e.g. bis(vinylsulfonylmethyl)ether, bis(vinylsulfonylethyl)ether etc. The best results in connection with the present invention can be obtained with bis(vinylsulfonyl)methane as a hardener.

The divinylsulfonyl hardeners in connection with the present invention may be used in combination with other hardeners such as e.g. aldehydes but most preferably the divinylsulfonyl hardeners are used as the sole hardeners. When used in combination with other hardeners the divinylsulfonyl hardeners may be used in one layer while the other hardener is used in another layer or they may be used in combination in the same layer.

To obtain the effect in connection with the present invention it is particularly important that the hardening at the photosensitive side of the imaging element is adjusted such that the time to completely brake down the surface layer, light sensitive layer and base layer using an aqueous solution of 0.14% by weight of NaOCl at 25° C. is between 1000sand 1600s, preferably between 1100s and 1500s.

The time needed to completely brake down said layers can be measured using a stamper that moves up and down with respect to the surface of the sample. The surface of the stamper contacting the surface of the sample is curved and has a curvature radius of 17 mm. The weight that the stamper exerts on the sample is 6 g. The stamper thereby moves through a spool causing an induction current which is proportional to the thickness of the sample. This induction current is amplified and monitored as a function of time, starting immediately after the NaOCl-solution has been applied to the sample. By monitoring the current as function of time, the decrease of the thickness of the sample as a consequence of the decomposition of the layers can be followed. The stamper was first calibrated using a sample of known thickness. Once the support is reached no further variation of the thickness will take place since the NaOCl solution is not capable of decomposing the support. Thus by measuring, immediately after bringing the NaOCl-solution on the sample, the time during which there is a reduction in the thickness of the sample, the time to completely brake down the layers can be measured.

The hardening at the photosensitive side can be controlled by various parameters such as e.g. the pH, temperature, time and concentration and combination of hardeners used. The exact hardening can be easily set by routine experimentation varying one or more of the above parameters.

According to the present invention the pH of the gelatin containing layer(s) to be hardened with a divinylsulfonyl hardener is preferably between 4 and 11 and more preferably between 4 and 6. A pH of less than 4 will generally yield too slow hardening reactions which is undesirable for producing the imaging element. In case a pH of more than 6 is used the divinylsulfonyl hardener will preferably be added from a separate alcoholic solution coated on top of said layer(s) in order to avoid stability problems of the coating solutions for the base and/or light sensitive layer.

The hardening level of the photosensitive side may further be controlled by subjecting the imaging element to an elevated temperature and controlled humidity for a predetermined time. Suitable temperatures for setting the hardening level are between 30° C. and 60° C. more preferably between 40° C. and 60° C. The humidity is preferably between 20% and 60% more preferably between 30% and 45%. Depending on the selected temperature and humidity the time for setting a desired hardening level will be between 1 hour and several days.

According to the present invention the total amount of divinylsulfonyl hardener on the photosensitive side is between 0.2 mmol and 0.6 mmol per gram of gelatin contained on the photosensitive side of the imaging element, more preferably between 0.35 mmol and 0.55 mmol.

According to a preferred embodiment in connection with the present invention the base layer and light sensitive layer contain gelatin being hardened with a divinylsulfonyl hardener. Both layers may be simultaneously coated to the support as described in e.g. EP-A-532076. The divinylsulfonyl hardener may be added to both layers or to the light sensitive layer from which it can diffuse to the base layer and/or the divinylsulfonyl hardener can be added to both layers by subsequent or simultaneously coating an alcoholic solution of the divinylsulfonyl hardener on top of the light sensitive layer.

Subsequent to the coating of both layers the element is preferably kept for some time at elevated temperature and controlled conditions of humidity to set the hardening level of both layers. Subsequent thereto the surface layer containing the physical development nuclei can be applied.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly-(ethylene terephthalate) film, polycarbonate film, polyvinyl-chloride film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. When a transparent support is used, the image-wise exposure of the imaging element may then proceed through the support and base layer, optionally serving as antihalation layer.

The photographic silver halide emulsion(s) of the light sensitive layer can be-prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion" The Focal Press, London (1966).

The photographic silver halide emulsion(s) used according to the present invention can be prepared by mixing the halide and silver solutions in partially or fully controlled conditions of temperature, concentrations, sequence of addition, and rates of addition. The silver halide can be precipitated according to the single-jet method or the double-jet method.

The silver halide particles of the light sensitive layer used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

According to the present invention the emulsion or emulsions preferably consist principally of silver chloride while a fraction of silver bromide may be present ranging from 1 mole % to 40 mole %. Most preferably the amount of bromide is kept below 5 mole %. The emulsions may further contain silver iodide in an amount of up to 5 mole % preferably up to 2 mole %.

The average size of the silver halide grains may range from 0.10 to 0.70 µm, preferably from 0.25 to 0.45 µm.

The size distribution of the silver halide particles can be homodisperse or heterodisperse. A homodisperse size distribution is obtained when 95% of the grains have a size that does not deviate more than 30% from the average grain size.

Preferably during the precipitation stage Iridium and/or Rhodium containing compounds or a mixture of both are added. The concentration of these added compounds ranges from $10^{-8}$ and $10^{-3}$ mole per mole of $AgNO_3$, preferably between $10^{-7}$ and $10^{-6}$ mole per mole of $AgNO_3$. This results in the building in the silver halide crystal lattice of minor amounts of Iridium and/or Rhodium, so-called Iridium and/or Rhodium dopants. As known to those skilled-in the art numerous scientific and patent publications disclose the addition of Iridium or Rhodium containing compounds or compounds containing other elements of Group VIII of the Periodic System during emulsion preparation.

The emulsion can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethanesulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The emulsion of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

The silver halide emulsion may contain the usual stabilizers e.g. homopolar or salt-like compounds of mercury with aromatic or heterocyclic rings such as mercaptotriazoles, simple mercury salts, sulphoniummercury double salts and other mercury compounds. Other suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the light sensitive layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168, 4,311,787 and DE-P 2,453,217.

In an especially preferred embodiment the emulsion layer contained in the imaging element contains a compound which comprises in its molecular structure a group capable of adsorbing to silver halide and a group capable of reducing silver halide. Compounds of this kind have been disclosed in EP-A-449340. In this way a combination of a stabilizing and a development activating function in one compound is achieved.

More details about the composition, preparation and coating of silver halide emulsions can be found in e.g. Product Licensing Index, Vol. 92, December 1971, publication 9232, p. 107–109.

In a preferred embodiment of the present invention the base-layer serves as an antihalation layer. This layer can therefore contain the same light-absorbing dyes as described above for the emulsion layer; as alternative finely divided carbon black can be used for the same antihalation purposes as described in U.S. Pat. No. 2,327,828. On the other hand, in order to gain sensitivety, light reflecting pigments, e.g. titaniumdioxide can be present. Further this layer can contain-hardening agents, matting agents having an average diameter of 1 to 10 µm such as e.g. silica particles or polymer particles such as e.g. polymethylmethacrylate, polyethylacrylate etc., and wetting agents. At least part of these matting agents and/or light reflection pigments may also be present in the silver halide emulsion layer the most part however preferably being present in said base-layer. The total amount of matting agents is preferably between 0.1 and 5 g/m² and more preferably between 0.1 and 2 g/m².

As a further alternative the light reflecting pigments may be present in a separate layer provided between the antihalation layer and the photosensitive silver halide emulsion layer. It is furthermore advantageous to add a water non-swellable latex particle to the base layer.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

According to the present invention at least the base layer and/or the light sensitive layer contain gelatin as a hydrophilic. colloid binder. Preferably however other hydrophilic layers, such as e.g. optional hydrophilic colloid layer(s) in water permeable relationship with the light sensitive layer, e.g. an intermediate layer between the light sensitive layer and surface layer, backing layer etc. also contain gelatin as hydrophilic colloid binder. Mixtures of different gelatins with different viscosities can be used to adjust the rheological properties of the layer. Like the light sensitive layer the other hydrophilic layers are coated preferably at a pH value below the isoelectric point of the gelatin. But partially instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

In order to obtain a printing plate having a sharp image and good resolution, the total amount of hydrophilic colloid on the light sensitive side of the imaging element is kept below 5 g/m².

The amount of hydrophilic colloid in the base layer is preferably between 2 and 6 g/m², while the amount of hydrophilic colloid in the light sensitive layer is preferably less than the amount of hydrophilic colloid in the base layer. Preferably the amount of hydrophilic colloid to the amount of silver halide in the light sensitive layer expressed as $AgNO_3$ is between 0.7 and 1.5.

The surface layer containing physical development nuclei is preferably free of hydrophilic binder but may comprise small amounts up to 30% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are heavy metal salts such as e.g. selenides, polyselenides, polysulphides, mercaptans, and tin (II) halides. Heavy metals, preferably silver, gold, platinum, palladium, and mercury can used in colloidal form.

According to the method of the present invention for making a lithographic printing plate, an imaging element as described above is image-wise exposed and subsequently developed in an alkaline processing liquid in the presence of one or more developing agents and one or more silver halide solvents.

According to the present invention the imaging element can be image-wise exposed in an apparatus according to its particular application, e.g. a conventional process camera containing a conventional light source or a laser containing device.

The alkaline processing liquid used for developing the imaging element in accordance with the method of the present invention preferably contains at least part of the silver halide solvent(s). Preferably the silver halide solvent is used in an amount between 0.01% by weight and 10% by weight and more preferably between 0.05% by weight and 8% by weight. Suitable silver halide solvents for use in connection with the present invention are e.g. 2-mercaptobenzoic acid, cyclic imides, oxazolidones, thiocyanates and thiosulfates. Further silver halide solvents that can be used in connection with the present invention are alkanolamines.

Alkanolamines that are suitable for use in accordance with the present invention may be of the tertiary, secundary or primary type. Examples of alkanolamines that may be used in connection with the present invention correspond to the following formula:

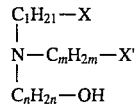

wherein X and X' independently represent hydrogen, a hydroxyl group or an amino group, 1 and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol etc. or mixtures thereof.

According to the present invention the alkanolamines are preferably present in the alkaline processing liquid in a concentration preferably between 0.1% and 10% by weight. However part or all of the alkanolamine can be present in one or more layers of the imaging element.

A further suitable type of silver halide solvents are thioether compounds. Preferably used thioethers correspond to the following general formula:

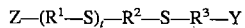

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain a oxygen bridge and t represents an integer from 0 to 10.

Examples of thioether compounds corresponding to the above formula are disclosed in e.g. U.S. Pat. No. 4,960,683 and specific examples are listed in table 1

TABLE 1

| | |
|---|---|
| $(HO-CH_2-CH_2)_2S$ | 1 |
| $HO-CH_2-CH_2-S-CH_2-S-CH_2-CH_2-OH$ | 2 |
| $HO-CH_2-CH_2-S-(CH_2)_2-S-CH_2-CH_2-OH$ | 3 |
| $HO-CH_2-CH_2-S-(CH_2)_3-S-CH_2-CH_2-OH$ | 4 |
| $HO-CH_2-CH_2-S-(CH_2)_4-S-CH_2-CH_2-OH$ | 5 |
| $C_2H_5-S-CH_2-CH_2-S-CH_2-CHOH-CH_2-OH$ | 6 |
| $(HOCH_2-CH_2-S-CH_2-CH_2)_2O$ | 7 |
| $HO-CH_2-CH_2-S-CH_2-CH_2-N(CH_3)_2$ | 8 |
| $(HO-CH_2-CHOH-CH_2-S-CH_2)_2$ | 9 |
| $HOOC-CH_2-S-CH_2-S-CH_2-COOH$ | 10 |
| $HOOC-CH_2-S-(CH_2)_2-S-CH_2-COOH$ | 11 |
| $HOOC-CH_2-S-(CH_2)_3-S-CH_2-COOH$ | 12 |

TABLE 1-continued

| | |
|---|---|
| $HOOC-(CH_2)_2-S-CH_2-S-(CH_2)_2-COOH$ | 13 |
| $HOOC-(CH_2)_2-S-(CH_2)_2-S-(CH_2)_2-COOH$ | 14 |
| $HOOC-(CH_2)_2-S-(CH_2)_3-S-(CH_2)_2-COOH$ | 15 |
| $CH_3-S-CH_2-CH_2-\underset{\underset{NH_2}{\|}}{CH}-COOH$ | 16 |

According to the present invention the alkaline processing liquid preferably also contains hydrophobizing agents for improving the hydrophobicity of the silver image obtained in the image receiving surface layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. Nos. 3,776,728, and 4,563,410.

According to the present invention the hydrophobizing agents are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/l.

According a particularly preferred embodiment in connection with the present invention, yielding particularly good printing plates, the alkaline processing liquid contains a meso-ionic compound as a regulating compound. Meso-ionic compounds as referred to in the present invention are a group of compounds defined by W. Baker and W. D. Ollis as "5- or 6-membered heterocyclic compounds which cannot be represented satisfactorily by any one covalent or polar structure and possesses a sextet of π-electrons in association with the atoms comprising the ring. The ring bears a fractional positive charge balanced by a corresponding negative charge located on a covalently attached atom or group of atoms" as described in *Quart. Rev.*, Vol. 11, p. 15 (1957) and *Advances in Heterocyclic Chemistry*, Vol. 19, P. 4 (1976).

Preferred meso-ionic compounds are those represented by formula (I):

$$M^+—A^-  \quad (I)$$

wherein M represents a 5- or 6-membered heterocyclic ring composed of at least one member selected from the group consisting of a carbon atom, a nitrogen atom, an oxygen atom, a sulfur atom and a selenium atom; and A' represents $-O^-$, $-S^-$ or $-N^-—R$, wherein R represents an alkyl group (preferably having 1 to 6 carbon atoms), a cycloalkyl group (preferably having 3 to 6 carbon atoms), an alkenyl group (preferably having 2 to 6 carbon atoms), an alkynyl group (preferably having 2 to 6 carbon atoms), an aralkyl group, an aryl group (preferably having 6 to 12 carbon atoms), or a heterocyclic group (preferably having 1 to 6 carbon atoms).

In formula (I), examples of the 5-membered heterocyclic ring as represented by M include an imidazolium ring, a pyrazolium ring, an oxazolium ring, an isoxazolium ring, a thiazolium ring, an isothiazolium ring, a 1,3-dithiol ring, a 1,3,4- or 1,2,3-oxadiazolium ring, a 1,3,2-oxathiazolium ring, a 1,2,3-triazolium ring, a 1,3,4-triazolium ring, al, 1,3,4-, 1,2,3- or 1,2,4-thiadiazolium ring, a 1,2,3,4-oxatriazolium ring, a 1,2,3,4-tetrazolium ring and a 1,2,3,4-thiatriazolium ring.

Preferred meso-ionic compounds for use in accordance with the present invention are triazolium thiolates and more preferably 1,2,4-triazolium-3-thiolates and most preferably those that correspond to the following formula:

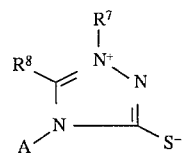

wherein $R^7$ and $R^8$ each independently represents an alkyl group, alkenyl group, cycloalkyl group, aralkyl group, aryl group or heterocyclic group each of which groups may be substituted or not, A represents an alkyl group, alkenyl group, cycloalkyl group, aralkyl group, aryl group, heterocyclic group each of which groups may be substituted or represents $-NR^9R^{10}$ wherein $R^9$ and $R^{10}$ each independently represents hydrogen, a substituted or unsubstituted alkyl group or a substituted or unsubstituted aryl group or wherein $R^7$ and $R^8$ or $R^8$ and A or $R^9$ and $R^{10}$ together with the atoms to which they are attached represent the necessary atoms to form a 5- or 6-membered ring.

Specific examples of 1,2,4-triazolium-3-thiolates suitable for use in accordance with the present invention are shown in table 1.

TABLE 2

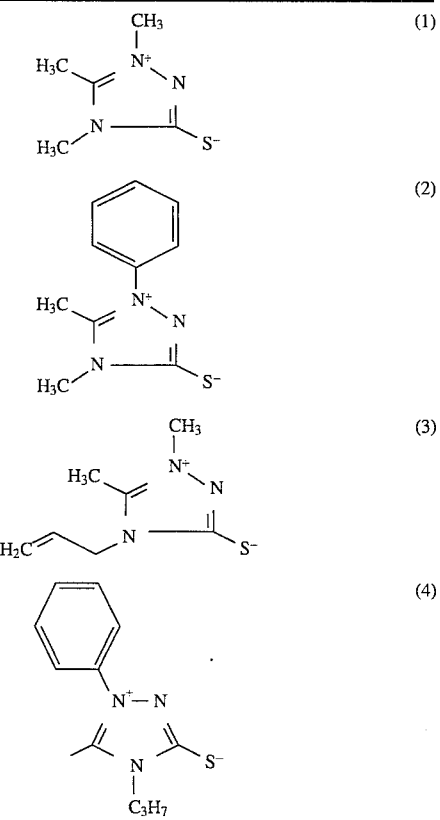

TABLE 2-continued (5) [structure: triazole with N(CH3)2 and S-]

(6) [structure: triazole with NH2 and S-]

(7) [structure: phenyl-triazole with NH2 and S-]

(8) [structure: triazole with dimethylallyl group and S-]

(9) [structure: imidazole derivative with CH3 groups and S-]

According to a preferred embodiment of the present invention at least part and most preferably all of the meso-ionic compound is preferably present in the alkaline processing liquid used for developing the image-wise exposed imaging element. Preferably the amount of meso-ionic compound in the alkaline processing liquid is between 0.1 mmol/l and 25 mmol/l and more-preferably between 0.5 mmol/l and 15 mmol/l and most preferably between 1 mmol/l and 8 mmol/l.

However the meso-ionic compound may be incorporated in one or more layers comprised on the support of the imaging element. This offers the advantage of replenishment of said meso-ionic compound in the alkaline processing liquid. Preferably the meso-ionic compound is incorporated in a layer of the imaging element that does not contain silver halide such as e.g. in a backing layer, a subbing layer etc. The meso-ionic compound is preferably contained in the imaging element in a total amount between 0 1 and 10 mmol/m$^2$, more preferably between 0.1 and 0.5 mmol/m$^2$ and most preferably between 0.5 and 1.5 mmol/m$^2$.

The alkaline processing liquid used in accordance with the present invention preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help maintain the pH and serve as a silver halide complexing agent.

The alkaline processing liquid may also contain the developing agent(s) used in accordance with the present invention. In this case the alkaline processing liquid is called a developer. On the other hand some or all of the developing agent(s) may be present in one or more layers of the imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. However other developing agents can be used.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners.

Development acceleration can be accomplished with the aid of various compounds to the alkaline processing liquid and/or one or more layers of the photographic element, preferably polyalkylene derivatives having a molecular weight of at least 400 such as those described in e.g. U.S. Pat. Nos. 3,038,805, 4,038,075, 4292,400, 4,975,354.

Subsequent to the development in an alkaline processing liquid the surface of the printing plate is preferably neutralized using a neutralization liquid.

A neutralization liquid generally has a pH between 5 and 7. The neutralization liquid preferably contains a buffer e.g. a phosphate buffer, a citrate buffer or mixture thereof. The neutralization solution can further contain bactericides, e.g. phenol, thymol or 5-bromo-5-nitro-1,3-dioxan as described in EP 0,150,517. The liquid can also contain substances which influence the hydrophobic/hydrophilic balance of the printing plate obtained after processing of the DTR element, e.g. silica. Further the neutralization solution can contain wetting agents, preferably compounds containing perfluorinated alkyl groups.

The invention will now be illustrated by the following examples without however the intention to limit the invention thereto. All parts are by weight unless otherwise specified.

EXAMPLE

Preparation of the silver halide emulsion coating solution.

A silver chlorobromide emulsion composed of 98.2 mol % of chloride and 1.8 mol % of bromide was prepared by the double jet precipitation method. The average silver halide grain size was 0.4 μm (diameter of a sphere with equivalent volume) and contained Rhodium ions as internal dopant.

The emulsion was orthochromatically sensitized and stabilized by a 1-phenyl-5-mercapto-tetrazole.

Preparation of a comparitive imaging element

An emulsion prepared as described above was coated to a polyethylene terephthalate film support together with a base layer such that the amount of gelatin in the base layer was 2.7 g/m$^2$ and 1.34 g/m$^2$ for the silver halide emulsion layer. The amount of silver halide expressed as AgNO$_3$ was 1.25 g/m$^2$ and the emulsion layer further contained developing agents and 80 mg/m$^2$ of formaldehyde as a hardener. The base layer further contained a silica matting agent having an average particle size of 3.4 μm and carbon black as anti-halation means. The pH of the base layer and silver halide emulsion layer was respectively 4.8 and 4.2.

The thus obtained element was kept at 57° C. at a relative humidity of 34% for 1 day.

To a thus obtained element was then coated a surface layer of PdS nuclei serving as physical development nuclei. This surface layer also contained 0.4 g/m$^2$ of hydroquinone and 100 mg of formaldehyde. The material was then stored for 1 day at 57° C. at a relative humidity of 34% to obtain a final level of hardening such that the time to brake down the surface layer, emulsion layer and base layer was 900s.

Preparation of imaging elements according to the invention:

Imaging elements according to the invention were prepared similar to the above comparitive imaging element with the following modifications:

instead of formaldehyde in the silver halide emulsion layer there was used bis(vinylsulfonyl)methane (hereinafter abbreviated as DVS) in amounts as specified in table 3;

no formaldehyde was used in the surface layer;

before coating the surface layer the element was stored for 1 day at 57° C. and 34% relative humidity;

The following alkaline processing solution was prepared:

| sodium hydroxide (g) | 30 |
| sodium sulphite anh. (g) | 35 |
| compound 9 of table 2 (g) | 1.2 |
| 2-aminoethyl-aminoethanol (ml) | 45 |
| 2-mercapto-5-n.heptyl-oxa-3,4-diazole (mg) | 350 |
| water to make | 1000 ml |

The following neutralization solution was prepared:

| citric acid | 10 g |
| sodium citrate | 35 g |
| sodium sulphite anh. | 5 g |
| phenol | 50 mg |
| water to make | 1 l |

The following dampening liquid was prepared:

| water | 880 ml |
| citric acid | 6 g |
| boric acid | 8.4 g |
| sodium sulphate anh. | 25 g |
| ethyleneglycol | 100 g |
| colloidal silica | 28 g |

The above described imaging elements were image-wise exposed and processed at 30° C. with one of the above described alkaline processing solution, subsequently neutralized at 25° C. with the neutralization solution described above and dried.

The printing plates thus prepared were mounted on an offset printing machine (Heidelberg GTO-46). The ink used was a commonly employed ink. During the printing run the described dampening solution was used. The printing endurance, i.e. the number of acceptable copies was then evaluated and a number was assigned to indicate the printing endurance as follows:

| <2000 copies | 0 |
| 2000–4000 | 1 |
| 4000–8000 | 2 |
| >8000 | 3 |

The obtained results are shown in table 3.

TABLE 3

| sample no. | hardener type | amount (mmol) | brake-down time (s) | Printing endurance |
|---|---|---|---|---|
| 1 | formaldehyde | 6 | 900 | 2 |
| 2 | DVS | 0.5 | 940 | 1 |
| 3 | DVS | 1.0 | 1030 | 2 |
| 4 | DVS | 2.0 | 1280 | 3 |
| 5 | DVS | 2.1 | 1380 | 3 |
| 6 | DVS | 2.8 | 1720 | 1 |
| 7 | DVS | 3.5 | 1980 | 0 |

We claim:

1. An imaging element comprising on the same side of a support in the order given a base layer, a light sensitive layer containing a silver halide emulsion and a surface layer comprising physical development nuclei characterized in that said base layer and/or said light-sensitive layer comprises gelatin hardened with a divinylsulfonyl hardener such that the time needed to completely brake down said base layer, light sensitive layer and surface layer using an aqueous solution of 0.14% by weight of NaOCl at 25° C. is between 1000s and 1600s.

2. An imaging element according to claim 1 wherein said divinylsulfonyl hardener corresponds to the following formula:

$$CH_2\!\!=\!\!CH\!-\!SO_2\!-\!A\!-\!SO_2\!-\!CH\!\!=\!\!CH_2 \qquad (I)$$

wherein A represents a divalent linking group selected from the group consisting of:

a substituted or unsubstituted aliphatic or aromatic hydrocarbon group containing 1 to 8 carbon atoms and —X—O—X' wherein X and X' each independently represent a substituted or unsubstituted aromatic or aliphatic hydrocarbon group, the total number of carbon atoms in X an X' not exceeding 8.

3. An imaging element according to claim 1 wherein said light sensitive layer or base layer when comprising gelatin being hardened with said divinylsulfonyl hardener has a pH between 4 and 6.

4. A method for making a lithographic printing plate comprising the steps of:

image-wise exposing an imaging element comprising on the same side of a support in the order given a base layer, a light sensitive layer containing a silver halide emulsion and a surface layer comprising physical development nuclei, said base layer and/or said light-sensitive layer comprising gelatin being hardened with a divinylsulfonyl hardener such that the time needed to completely brake down said base layer, light sensitive layer and surface layer using an aqueous solution of 0.14% by weight of NaOCl at 25° C. is between 1000s and 1600s and subsequently developing a thus obtained image-wise exposed imaging element in the presence of a developing agent and a silver halide solvent using an alkaline processing liquid.

5. A method according to claim 4 wherein said silver halide solvent is contained in said alkaline processing liquid that further comprises a meso-ionic compound.

6. A method according to claim 4 wherein said silver halide solvent is selected from the group consisting of a thioether and an alkanolamine.

7. A method according to claim 4 wherein said divinylsulfonyl hardener corresponds to the following general formula:

$$CH_2\!=\!CH\!-\!SO_2\!-\!A\!-\!SO_2\!-\!CH\!=\!CH_2 \qquad (I)$$

wherein A represents a divalent linking group selected from the group consisting of:

a substituted or unsubstituted aliphatic or aromatic hydrocarbon group containing 1 to 8 carbon atoms and —X—O—X' wherein X and X' each independently represent a substituted or unsubstituted aromatic or aliphatic hydrocarbon group, the total number of carbon atoms in X an X' not exceeding 8.

* * * * *